United States Patent [19]
Manchester

[11] Patent Number: 6,080,654
[45] Date of Patent: Jun. 27, 2000

[54] SIMPLIFIED METHOD OF FORMING SELF-ALIGNED VIAS IN A SEMICONDUCTOR DEVICE

[75] Inventor: Terence Manchester, Los Gatos, Calif.

[73] Assignee: Advanced Micro Devices, Inc., Sunnyvale, Calif.

[21] Appl. No.: 09/377,900

[22] Filed: Aug. 20, 1999

[51] Int. Cl.[7] .................................................. H01L 21/4763
[52] U.S. Cl. .......................... 438/622; 438/583; 438/395; 257/374
[58] Field of Search ..................................... 438/583, 158, 438/622, 395, 314; 205/667; 505/413

[56] References Cited

U.S. PATENT DOCUMENTS

| | | | |
|---|---|---|---|
| 5,741,626 | 4/1998 | Jain et al. | 430/314 |
| 5,869,395 | 2/1999 | Yim | 438/637 |
| 5,879,866 | 3/1999 | Starikov et al. | 430/395 |

*Primary Examiner*—Matthew Smith
*Assistant Examiner*—Granvill D. Lee, Jr.

[57] ABSTRACT

High density, multi-metal layer semiconductor devices are formed with self-aligned vias and reliable interconnection patterns employing photolithography without the use of a photomask. Embodiments include modulating the amount of energy reflected into an overlying photoresist layer from underlying components to effect differential exposure of the photoresist layer.

13 Claims, 2 Drawing Sheets

SIMPLIFIED METHOD OF FORMING SELF-ALIGNED VIAS IN A SEMICONDUCTOR DEVICE

TECHNICAL FIELD

The present invention relates to a method of manufacturing a semiconductor device having accurate, uniform and self-aligned vias. The present invention is applicable to manufacturing high speed integrated circuits having submicron design features and high conductivity reliable interconnect structures.

BACKGROUND ART

Current demands for high density and performance associated with ultra large scale integration require design rules of about 0.18 microns and under, increased transistor and circuit speeds and improved reliability. As device scaling plunges into the deep sub-micron ranges, it becomes increasingly difficult to maintain performance and reliability.

In the manufacture of semiconductor devices, photolithography is conventionally employed to transform complex circuit diagrams into patterns which are defined on the wafer in a succession of exposure and processing steps to form a number of superimposed layers of insulator, conductor and semiconductor materials. Scaling devices to smaller geometries increases the density of bits/chip and also increases circuit speed. The minimum feature size, i.e., the minimum line-width or line-to-line separation that can be printed on the surface, controls the number of circuits that can be placed on the chip and directly impacts circuit speed. Accordingly, the evolution of integrated circuits is closely related to and limited by photolithographic capabilities.

An optical photolithographic tool includes an ultraviolet (UV) light source, a photomask and an optical system. A wafer is covered with a photosensitive layer, called resist, because of its ability to resist etchants. The photomask is flooded with UV light and the mask pattern is imaged onto the resist by the optical system. Photoresists are organic compounds whose solubility in a developer changes as a result of exposure to light or x-rays. The exposed regions become either more soluble or less soluble in a developer solvent.

There are, however, significant problems attendant upon the use of conventional photolithography to form patterns for subsequent processing. When a thin resist layer is coated on a reflective surface and exposed to monochromatic radiation, standing waves are produced in the resist. The reflected wave interferes with the incoming radiation wave and causes the light intensity to vary periodically in a direction normal to the resist. Standing waves cause variations in the development rate along the edge of the resist and degrade the image resolution.

For example, when a photoresist is coated on a highly reflective surface, such as silicon nitride which has an index of refraction of about 2.00, and exposed to monochromatic radiation, undesirable standing waves are produced as a result of interference between the reflected wave and the incoming radiation wave. In particular, standing waves are caused when the light waves propagate through a photoresist layer down to the silicon nitride layer, where they are reflected back up through the photoresist, and through the silicon nitride to the substrate, when they are again reflected to the photoresist.

These standing waves cause the light intensity in the resist film to vary periodically as a function of resist thickness, thereby creating variations in the development rate along the edges of the resist and leading to uncontrolled linewidth variations. These refections make it difficult to control critical dimensions (CDs) such as linewidth and spacing of the photoresist and have a corresponding negative impact on the CD control in superimposed layers of insulator, conductor and semiconductor materials.

Highly reflective transparent substrates accentuate the standing wave effects, and thus one approach to addressing the problems associated with the high reflectivity of the silicon nitride layer has been to attempt to suppress such effects through the use of dyes and anti-reflective coatings below the photoresist layer. For example, an anti-reflective coating (ARC), such as a polymer film, has been deposited directly on the silicon nitride layer. The ARC serves to eliminate reflection of most of the radiation that penetrates the photoresist thereby reducing the negative effects stemming from the underlying reflective materials during photoresist patterning. Unfortunately, use of an ARC adds significant drawbacks with respect to process complexity. To utilize an organic or inorganic ARC, the process of manufacturing the semiconductor chip must include a process step for depositing the ARC material, and also a step for prebaking the organic ARC or depositing a protective coating on the inorganic ARC before spinning the photoresist.

There exists a need for a cost effective, simplified processes enabling the formation of a self-aligned via which eliminate the need for a photomask and the negative effects stemming from the underlying reflective materials during photoresist patterning.

The present invention addresses and solves the problems attendant upon conventional multi-step, time-consuming and complicated processes for manufacturing semiconductor devices utilizing photolithography.

DISCLOSURE OF INVENTION

An advantage of the present invention is an efficient, cost-effective method of manufacturing a semiconductor device with accurately formed self-aligned vias.

Additional advantages of the present invention will be set forth in the description which follows, and in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing semiconductor device, which method comprises:

forming a second dielectric layer having a predetermined thickness on the metal feature;

forming a photoresist layer on the second dielectric layer; and flood illuminating to pattern the photoresist;

wherein the thickness and refractive index of the first and second dielectric layers are selected to cause light which has entered therein to be at least partially trapped and multiply reflected between the substrate/first dielectric layer interface and the first dielectric layer/second dielectric layer interface, thereby differentially exposing the photoresist layer to create a pattern susbstantially aligned over the metal feature.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
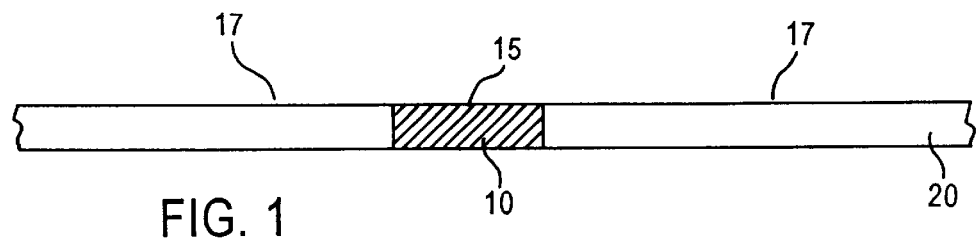
FIGS. 1–6 schematically illustrate sequential phases of a method in accordance with an embodiment of the present invention.

The present invention addresses and solves problems stemming from conventional, costly and time-consuming methodologies of fabricating electrical connections in semiconductor devices, e.g., vias. Such problems include a necessity to compensate for possible misalignment of the via mask. For example, a misalignment of the via mask may shift the via sideways so that the via is not formed entirely over an underlying conductor. Instead, the via may overlap onto the dielectric layer along side the conductor, exposing the dielectric layer during the via etch step. The groove may cause microcracking or thinning of a further conductor when it is deposited in and over the via to contract the underlying conductor. This can be avoided by widening the underlying conductor at the via location so that even a misaligned via will not overlap onto the first dielectric layer. However, locally widening the underlying conductor conflicts with the goal of reducing the size of the integrated circuit and increasing density.

The present invention constitutes an improvement over conventional practices stemming from conventional, costly and time-consuming methodologies of fabricating electrical connections in semiconductor devices. The present invention enables the formation of self-aligned vias with accurately controlled critical dimensions. In accordance with embodiments of the present invention, the semiconductor device can be formed by: forming a metal feature having side surfaces and an upper surface in a first dielectric layer over a semiconductor substrate;

forming a second dielectric layer having a predetermined thickness on the metal feature;

forming a photoresist layer on the second dielectric layer; and flood illuminating to pattern the photoresist;

wherein the thickness and refractive index of the first and second dielectric layers are selected to cause light which has entered therein to be at least partially trapped and multiply reflected between the substrate/first dielectric layer interface and the first dielectric layer/second dielectric layer interface, thereby differentially exposing the photoresist layer to create a pattern susbstantially aligned over the metal feature.

An embodiment of the present invention is schematically illustrated shown in FIGS. 1–6, wherein similar elements bear similar references numerals. Adverting to FIG. 1, a patterned metal layer comprising a metal feature 10 having an upper surface 15 separated by gaps 17, such as metal lines separated by interwiring spacings, are formed in a first dielectric layer 20 on a semiconductor substrate, such as silicon, (not shown). Though not shown, openings are initially formed in the first dielectric layer 20, as by conventional photolithographic and etching techniques, and the patterned metal layer is formed on the dielectric layer, as by filling the openings with a metal and conducting chemical-mechanical polishing (CMP). Thus a substantially planarized surface is formed with the upper surfaces of the metal 15 substantially coplanar with the upper surface of the first dielectric layer. In carrying out the embodiments of the present invention, the first dielectric layer can be formed of any material typically employed in manufacturing semiconductor devices, such as silicon oxide ($SiO_n$), silicon oxynitride (SiON), silicon nitride (SiN) and spin-on-glasses (SOG). The thickness of the first dielectric layer 20 is selected to cause light which has entered therein to be at least partially absorbed, i.e., at least partially trapped and multiply reflected therein. Embodiments of the present invention comprise forming the first dielectric layer to a thickness of about 100 Å to about 10,000 Å. Metal feature 10 can be formed of any metal typically employed in manufacturing semiconductor devices, such as aluminum, aluminum alloys, copper, copper alloys, gold, gold alloys, silver, silver alloys, refractory metals, refractory metal alloys, and refractory metal compounds.

Figure 2:
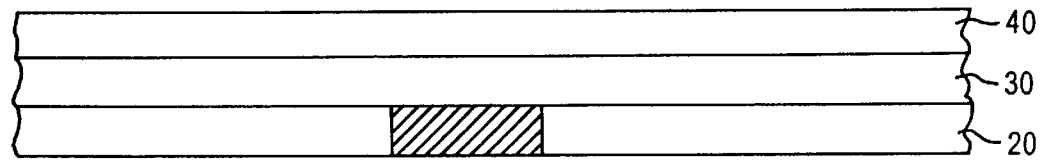

Adverting to FIG. 2, a second dielectric layer 30 is formed on the patterned metal layer in the first dielectric layer 20. The second dielectric layer can be formed of any material typically employed in manufacturing semiconductor devices, such as those used in the first dielectric layer. Thereafter, a resist 40 is formed on the second dielectric layer 30. The resist employed in the present invention can comprise any resist conventionally employed in the manufacture of semiconductor devices, such as positive or negative resists.

Figure 3:
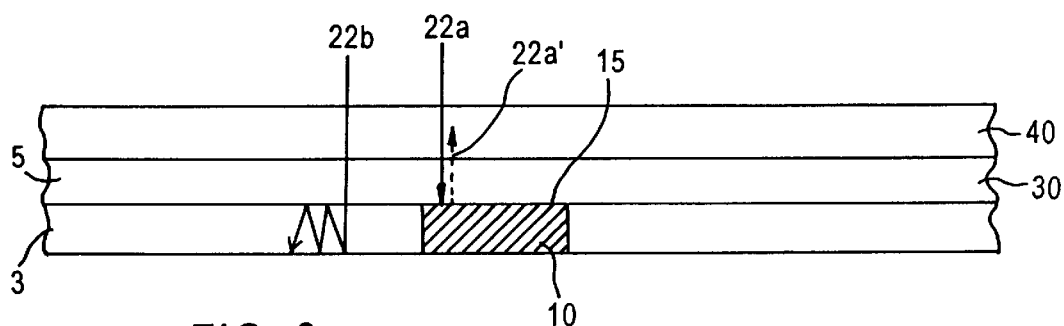

Adverting to FIG. 3, the stack is then flood illuminated with an ultraviolet (UV) light source. The light source employed in the present invention can comprise any UV light source conventionally employed in the manufacture of semiconductor devices, such as a high-pressure arc lamp or a laser source. Embodiments of the present invention comprise flood illuminating light with a deep ultraviolet (DUV) spectrum, such as from about 100 nm to about 300 nm, flood illuminating light with a mid-UV spectrum, such as from about 300 nm to about 360 nm, and flood illuminating light with a near-UV spectrum, such as from about 360 nm to about 450 nm.

With continued reference to FIG. 3, incident UV light ray 22a passes through the positive resist 40 and the second dielectric layer 30. Incident UV light ray 22a then strikes the reflective upper surface 15 of the metal line 10 and light ray 22a' is reflected back through the second dielectric layer 30 and the positive resist 40. UV light ray 22b passes through the positive resist 40, the second dielectric layer 30 and the first dielectric layer 20, i.e., UV light ray 22b does not strike the upper surface 15 of the metal line 10, and is at least partially trapped therein and is multiply reflected between the substrate/first dielectric layer interface 3 and the first dielectric layer/second dielectric layer 5. The amount of light deposited in the resist above the metal line is greater, such as from about 1% to about 60% greater, than the amount of light deposited in the remaining portion of the positive resist. In this embodiment, the resist is selected to have a sharpness in transition from exposure to reflected light. Accordingly, the photoreactive compound in the resist is destroyed by exposure to the higher light energy.

Figure 4:
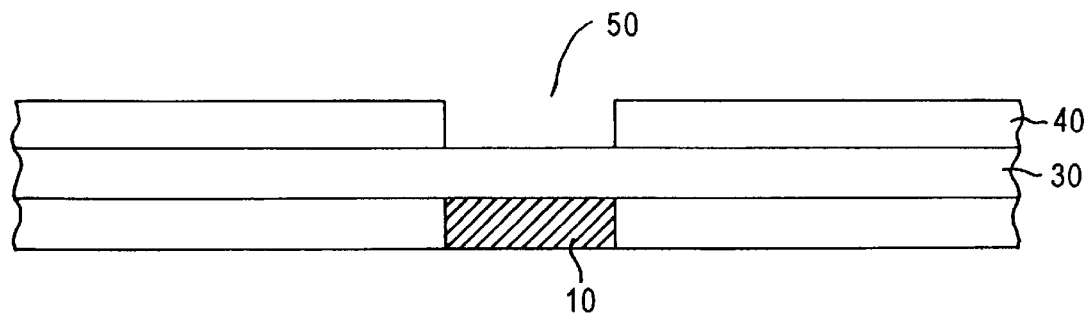

As shown in FIG. 4, upon application of developer solvent, the regions of resist above metal line 10 are dissolved away, thereby forming a hole 50 in the resist 40 to provide an opening through which etching of the underlying second dielectric layer 30 may take place. With continued reference to FIG. 4, the present method closely controls critical dimensions, such as a line width and spacing of the hole 50 in the resist 40, thereby preventing distortions occurring in forming the hole that may affect the dimensions of the ultimately formed via. As mentioned above, such distortions in patterning the photoresist 40 occur in conventional methodologies as a result of the high reflectivity and thickness variations of materials and cause nonuniform photo-reflectivity.

Figure 5:
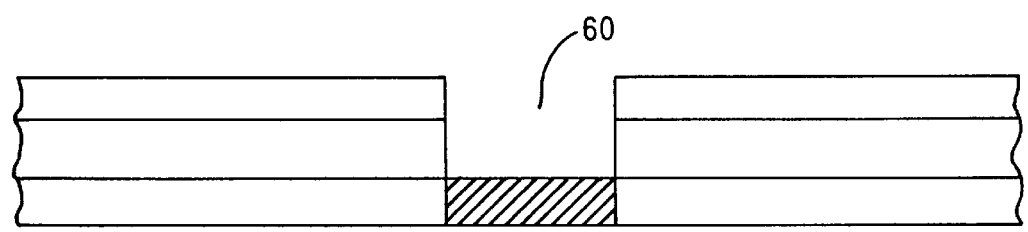

Referring to FIG. 5, through-hole 60 is formed in the second dielectric layer 30, such as by conventional plasma etching or wet etching of the second dielectric layer 30. As shown, through-hole 60 is substantially self-aligned with the underlying metal line 10.

Figure 6:
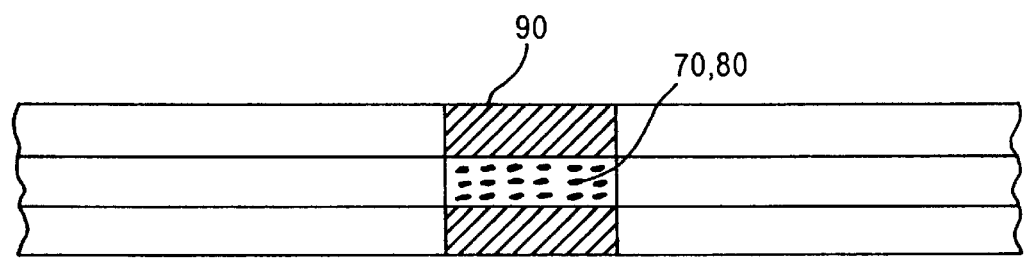

With reference to FIG. 6, the resist 40 is removed in a conventional manner and the through-hole is then filled with a metal plug 70 to form a self-aligned conductive via 80 which can electrically connect metal feature 90 which is part of a second patterned metal layer.

At this point, the formation of a metallization structure is completed, and the wafer continues to the next stage in the overall manufacturing process.

In accordance with the present invention, metallization structures are formed in an elegantly simplified, efficient and cost-effective manner. Advantageously, a self-aligned via is formed with the use of a conventional photomask thereby avoiding the negative effects stemming therefrom during photoresist patterning. The present invention is particularly advantageous in forming metallization interconnection patterns, particularly in various types of semiconductor devices having sub-micron features and high aspect ratios.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device, which method comprises:
   forming a metal line having side surfaces and an upper surface in a first dielectric layer over a semiconductor substrate;
   forming a second dielectric layer having a predetermined thickness on the metal line;
   forming a photoresist layer on the second dielectric layer; and
   flood illuminating to pattern the photoresist without a photomask;
   wherein the thickness and refractive index of the first and second dielectric layers are selected to cause light which has entered therein to be at least partially trapped and multiply reflected between the substrate/first dielectric layer interface and the first dielectric layer/second dielectric layer interface, thereby differentially exposing the photoresist layer to create a pattern substantially aligned over the metal line.

2. The method according to claim 1, wherein the first dielectric layer and the second dielectric layer are selected from the group consisting of silicon oxynitride, silicon dioxide, silicon nitride and spin-on-glass.

3. The method according to claim 1, comprising flood illuminating light with a deep ultraviolet (DUV) spectrum.

4. The method according to claim 3, wherein the spectrum is from about 100 nm to about 300 nm.

5. The method according to claim 1, comprising flood illuminating light with a mid-UV spectrum.

6. The method according to claim 5, wherein the spectrum is from about 300 nm to about 360 nm.

7. The method according to claim s, comprising flood illuminating light with a near-UV spectrum.

8. The method according to claim 7, wherein the spectrum is from about 360 nm to about 450 nm.

9. The method according to claim 1, wherein the photoresist is a positive photoresist.

10. The method according to claim 1, wherein the photoresist is a negative photoresist.

11. The method according to claim 1, comprising:
    forming a through-hole in the second dielectric layer exposing the upper surface of the first metal line.

12. The method according to claim 11, comprising:
    removing the photoresist; and
    filling the through-hole with a conductive material to form a self-aligned via.

13. A semiconductor device formed by the method of claim 1.

* * * * *